United States Patent [19]
McAllister et al.

[11] Patent Number: 5,378,927
[45] Date of Patent: Jan. 3, 1995

[54] THIN-FILM WIRING LAYOUT FOR A NON-PLANAR THIN-FILM STRUCTURE

[75] Inventors: Michael F. McAllister, Clintondale; James A. McDonald, Newburgh; Keshav Prasad, Poughkeepsie; Gordon J. Robbins, Wappingers Falls; Madhavan Swaminathan, Newburgh, all of N.Y.

[73] Assignee: International Business Machines Corporation, Armonk, N.Y.

[21] Appl. No.: 65,385

[22] Filed: May 24, 1993

[51] Int. Cl.⁶ .................. H01L 23/50; H01L 23/52
[52] U.S. Cl. ............................ 257/773; 257/774; 257/752; 257/776
[58] Field of Search ............ 257/686, 690, 698, 700, 257/736, 741, 750, 752, 758, 778, 773, 774, 776, 781

[56] References Cited
U.S. PATENT DOCUMENTS

| | | | |
|---|---|---|---|
| 4,430,365 | 2/1984 | Schaible et al. | 427/96 |
| 4,897,708 | 1/1990 | Clements | 257/690 |
| 5,149,674 | 9/1992 | Freeman et al. | 437/195 |
| 5,239,448 | 8/1993 | Perkins et al. | 257/686 |

Primary Examiner—Jerome Jackson
Assistant Examiner—Nathan K. Kelley
Attorney, Agent, or Firm—H. Daniel Schnurmann

[57] ABSTRACT

A thin-film arrangement for a non-planar structure is described. The structure includes a substrate and a plurality of thin-film layers stacked on top of each other above the substrate. The layers contain conductive patterns and vias that provide connections between the conductive pattern in one of the layers to the conductive pattern in another layer. Vias that provide a connection between the conductive pattern of one layer to the conductive pattern in another remotely located layer are offset and in contact with respect to each other and are positioned in a non-linear arrangement, preferably in the form of a helix or a multiple helix.

15 Claims, 6 Drawing Sheets

THIN-FILM WIRING LAYOUT FOR A NON-PLANAR THIN-FILM STRUCTURE

FIELD OF THE INVENTION

This invention relates to a wiring layout, and more particularly, to a thin-film wiring arrangement for a non-planar structure.

BACKGROUND OF THE INVENTION

Very large scale integrated (VLSI) semiconductor circuits are generally manufactured by depositing and patterning conductive and non-conductive layers on a substrate and by stacking these layers one on top of the other. As VLSI circuits become more sophisticated and more complex, the number of stacked layers or planes increases, thereby creating planarity problems. Much attention has been directed to solving this problem. By way of example, J. L. Freeman et al, in U.S. Pat. No. 5,149,674 provide a method for planarizing bonding and probe pads, and more particularly, multi-layer capture pads, in relation to the interior of the semiconductor VLSI devices.

A similar problem exists in packages onto which chips are attached, where although planarity has proven to present distinct advantages by better controlling critical dimensions and by more evenly distributing conductive and dielectric material, cost considerations may dictate maintaining a non-planar environment. This is particularly true for thin-film structures, and it is most evident in areas that surround vias. Vias are known in the art to establish electrical contact between wiring lines in one layer to wiring lines in some other layer, and to provide an external interface for interconnections. This contact can be maintained even if the lines to be contacted are not in adjacent planes, in which case contact is usually achieved by stacking vias one on top of the other. The process of stacking vias in a non-planar environment presents a problem in that vias display a dimple on the top surface usually caused by uneven deposition of the metal features. The dimple on the surface of a via causes a reduction in the surface area available for contact between vias, thus eliminating the use of stacked vias for process and reliability considerations. Moreover, when vias are stacked in a column, the effect of these dimples tends to compound, leading to a non-planar structure at the top surface.

Adding to the non-planarity problems, the manner in which a via column is laid out results in lines having non-uniform electrical characteristics due to the presence or absence of reference planes beneath or above the transmission lines. This unevenness causes a significant decrease in the uniformity of lines per channel for long wiring lengths.

Due to a non-planar environment, the design of the wiring layer and reference layers is critical since dielectric non-planarity introduces waviness in the lines that changes the electrical characteristics. The only viable method for maintaining uniform line characteristics is to have fixed areas in the layout for lines and fixed channels for wiring. This technique is used in a planar process to achieve uniformity by stacking the vias, thereby allocating specific areas for the vias and lines. Since vias in a non-planar process cannot be stacked and have interfaces with the lines, non-uniformity is thus produced both in the physical and electrical characteristics of the structure.

OBJECTS OF THE INVENTION

Accordingly, it is an object of the invention to provide an optimum via structure that creates a uniform layout in a non-planar environment.

It is another object of the invention to provide a non-planar structure having vias of uniform height in an ultra high bandwidth package.

It is a further object of the invention to have a plurality of thin-film planes or layers provided each, with lines and vias such that the vias are non-stacked and offset with respect to each other.

It is yet another object of the invention to have lines in a non-planar environment that maintain a uniform separation to the closest reference plane.

It is a more particular object of the invention to eliminate the effect of dimples in the successive layering of thin-film plane.

It is yet a further object of the invention to achieve a uniform height for all the vias reaching the top thin-film plane.

It is still a more particular object of the invention to maintain isolation between the vias and the lines to achieve good electric characteristic.

It is yet a more particular object of the invention to provide current sharing by establishing many parallel paths serviced by micro-vias.

It is still another object of the invention to achieve an improved reliability by introducing planar characteristics to a non-planar environment and by redundancies introduced by current sharing.

SUMMARY OF THE INVENTION

The present invention is an arrangement of vias in a thin-film structure, comprising a plurality of thin-film layers stacked on top of each other, the layers having wiring lines and a plurality of vias, the vias providing a connection between a line in one of the layers to a line in another of the layers; at least one of the vias in one of the layers being offset from and in contact with at least a via in a subsequent layer, and wherein a plurality of the connoting vias are positioned in a non-linear arrangement.

BRIEF DESCRIPTION OF THE DRAWINGS

While the novel features of the invention are set forth particularly in the appended claims, the invention will be better understood and appreciated, along with other objects and features thereof, from the following detailed description taken in conjunction with the accompanying drawings, in which:

DETAILED DESCRIPTION OF THE INVENTION

Thin-films provide a large variety of functions, such as limiting delta-I noise, by introducing a low inductance path to decoupling capacitors for large off-chip switching activity, high density wiring, small propagation delays and increased wirability for the redistribution and connection of wires. A good thin-film design is necessary to support critical nets and reduce noise, since these control the cycle time of a machine.

Figure 1A:
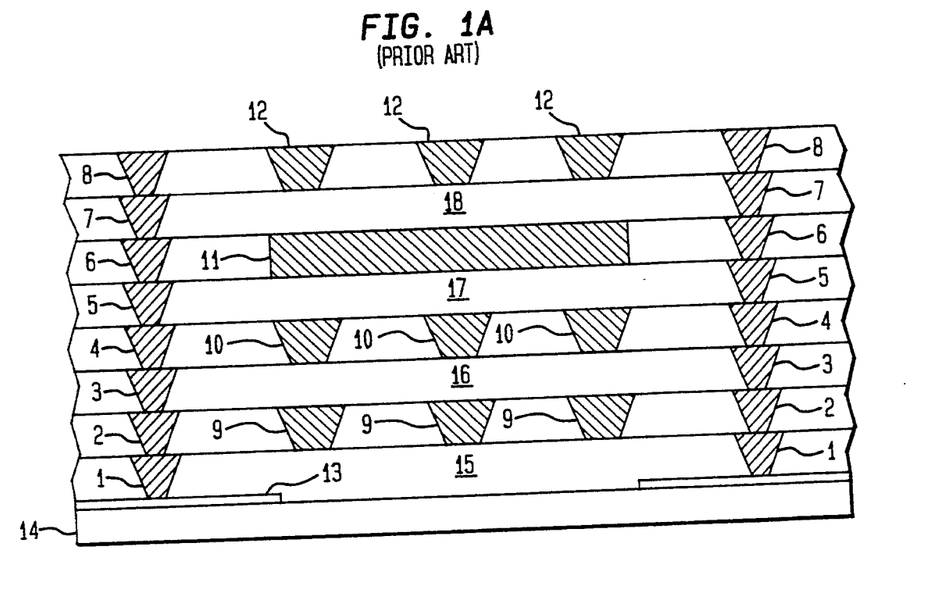
FIG. 1A is a schematic diagram of the cross section of a prior art arrangement of stacked vias using a planar thin-film process.
Figure 2:
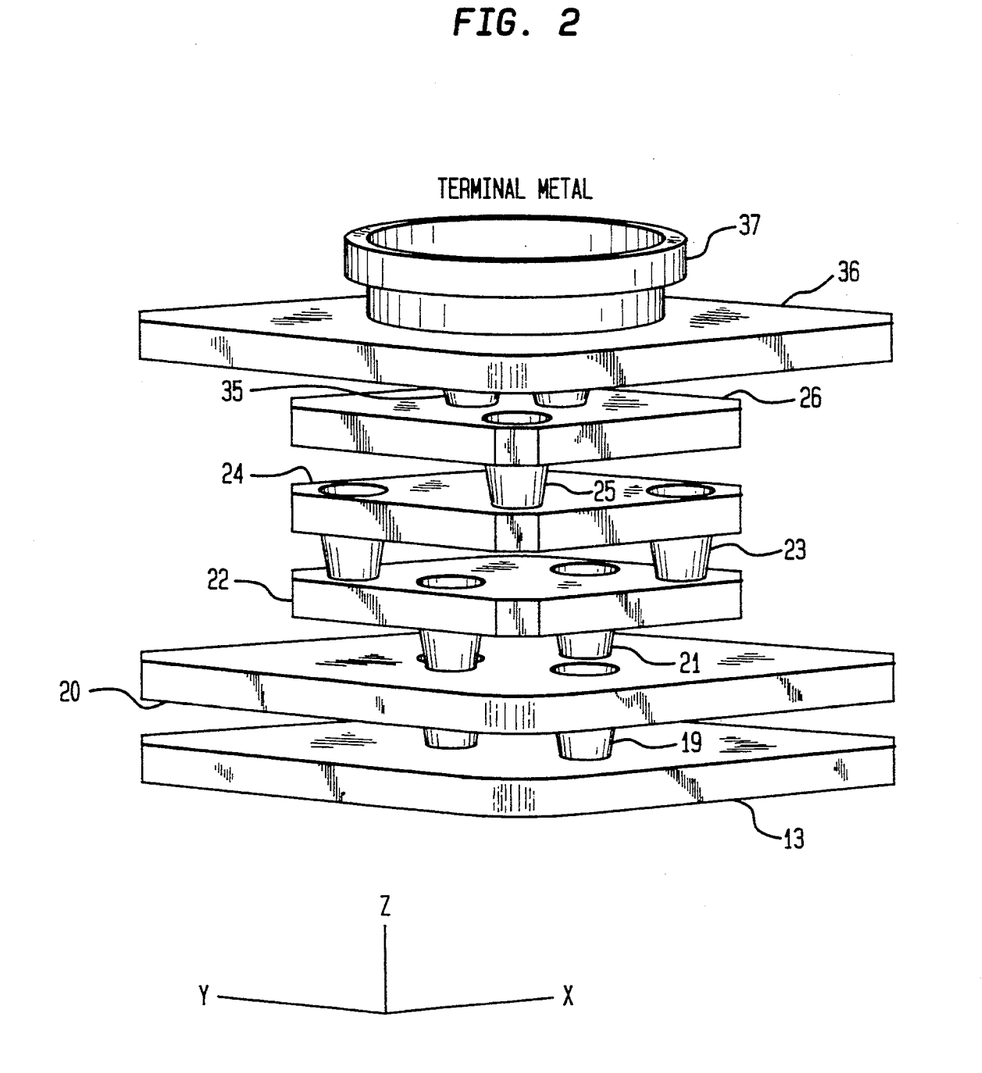
FIG. 2 shows a via staggering scheme that connects a substrate via to a chip placed on the top surface.
Figure 3A:
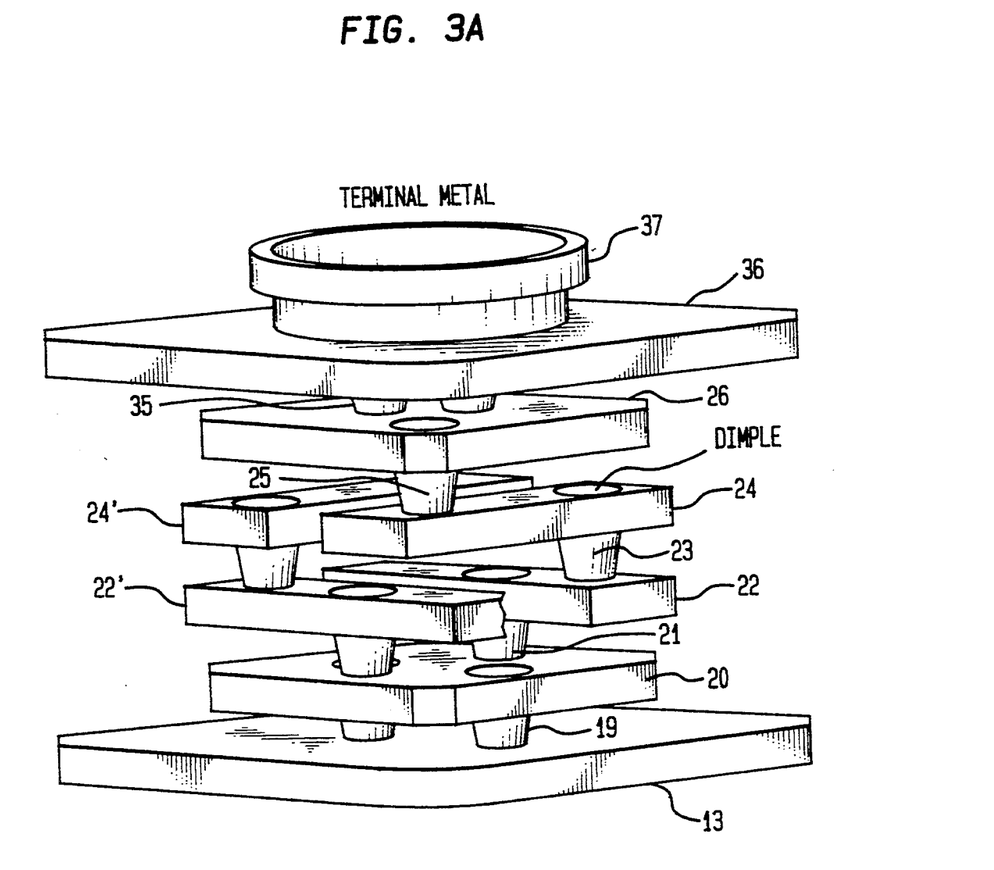
FIG. 3A shows a three dimensional representation a spiral via connection linking lines in the X layer, Y layer and a top mesh layer, in accordance with the present invention.

FIG. 1 illustrates a cross section of a prior art arrangement of stacked vias using a planar thin-film process. Shown is a structure consisting of a substrate 14, upon which various thin-film layers are placed one on top of the other to provide the necessary wiring. The thin-film wiring consists of a bottom reference plane 9, two layers 10 and 11 providing, respectively, X and Y wiring, preferably with lines orthogonal to each other, and a top reference plane 12. The bottom reference plane 9 is separated from the substrate by an insulator or dielectric layer 15. Likewise, the reference planes as well as the two wiring planes 9 and 10 are separated from each other by dielectric layers 16, 17 and 18. As previously mentioned, vias provide vertical interconnections between the various metal layers. The chips are attached to the top surface of the thin film structure by means of terminal capture pads 37 which are connected through vias to the thin film structure (FIGS. 2 and 3A).

The reference planes 9 and 12 are voltage or reference planes that supply voltage and current to the chips (not shown) as well as provide a return path for the wiring layers 10 and 11, thereby converting the wires into transmission lines that can support electrical signals for communication. The reference planes also provide shielding for the wiring layers, thereby providing a controlled electrical environment, limiting coupled noise and ensuring first incident switching of the receivers. The use of two reference planes has the added advantage of providing a short inductive path from any decoupling capacitors attached on the top surface to the drivers in the chips, which reduces delta I noise. Due to the shorter inductive path provided by the reference planes, it is now possible to support additional simultaneously switching drivers.

In a multilevel thin film process, the conductor and dielectric levels are built sequentially. The dielectric layer is deposited and the vias are formed. The conductor layer is then deposited. This conductor layer follows the contours of the underlying dielectric layer and, hence, the process is called the conformal via process. This leads to a dimple at the via location whose dimensions are equal to or less than the dimensions of the via itself. The dimensions of the dimple depends on the conductor metallization process and the thickness of the conductor metal. In most thin film structures, the conductor metal is equal to or less than the thickness of the dielectric level. When the conductor layer is vacuum deposited (sputtered or evaporated), the metal thickness on the walls of the via is less than the metal thickness on the base of the via. This will create a dimple almost the size of the original via itself. If the metal is deposited by electrolytic or electroless plating, the isotropic nature of plating will lead to a thickening of the copper layer along the walls of the via with time to the same extent as the copper layer on the planar surfaces of the base of the via. This will lead to a dimple smaller than the size of the via itself. In an extreme case, as the plating continues, the thickening of the via walls eventually leads to a situation when the walls coalesce and level out to form a via stud.

The cross section shown in FIG. 1A assumes a planar process that includes planarizing all dielectric and metal layers. Shown is a substrate 14, such as a glass ceramic or alumina material, which may or may not support any wiring in it. In the example shown in FIG. 1A, the substrate supports wiring. Layer 13 represents a metal layer (capture pad) that provides electrical connections between the vias in the thin-film and vias in the substrate. This is required due to substrate via distortion that provides an uncertainty in the placement of the substrate via. Layer 13 is typically 2–4$\mu$ thick. Vias 1, 2, . . . , 8 are conductive vias that provide vertical interconnections between various layers in the thin film wiring. The dielectric layers are made of organic dielectric polymer such as polyimide, benzo-cyclo-butene, to name only a few. Layers 15, 16, 17 and 18 are dielectric layers that ensure no electrical contact among the conductive layers 9, 10, 11, and 12. Layers 9 and 12 are reference planes comprising X and Y conductors, which are electrically connected on the same layer. Due to the large amount of metal present in those layers, they can act as voltage planes and supply current to the chips. Layers 10 and 11 are, respectively, X and Y wiring layers which supply the electrical interconnections. The X and Y direction wiring may be interchanged if necessary with no impact on the electrical characteristics. Since the reference planes 9 and 12 are physically in close proximity to wiring layers 10 and 11, they act as a return path for the wiring, thus converting the wires in 10 and 11 into transmission lines.

The electrical characteristics of the transmission lines in 10 and 11 can be varied by changing the physical position of the lines with respect to the conductors in the reference planes 9 and 12. For example, lines in 10 could be moved between two conductors in 9 and 12 to reduce the capacitance, while increasing the inductance and, hence, the impedance of the lines. Practitioners of the art will readily appreciate that since the process is planar, all lines have the same electrical characteristics, since they all see an identical electrical configuration. This is true irrespective of the wiring and reference plane layout due to the planar environment.

As previously mentioned, vias provide vertical interconnections. By way of example, vias 1, 2, . . . , and 8 provide vertical connections between substrate 14 and the chips (not shown) which are joined to the top of the thin-film structure. These vias could also provide vertical connections between 10 and 11 to change the direction of the wiring. As can be seen from the drawing, since the process is planar, all vias are stacked and, thus, vertically aligned. This provides a uniform height to all the parts of the package, i.e., to all the chips positioned on the top surface. It also provides a good electrical and mechanical contact surface for attaching the chips. Hence, the planar process provides two critical characteristics that are essential to any design, namely:

1. All lines have the same electrical characteristics due to the presence of identical electrical environments.
2. The structure provides uniform height and hence a good electrical and mechanical surface for attaching chips.

Figure 1B:
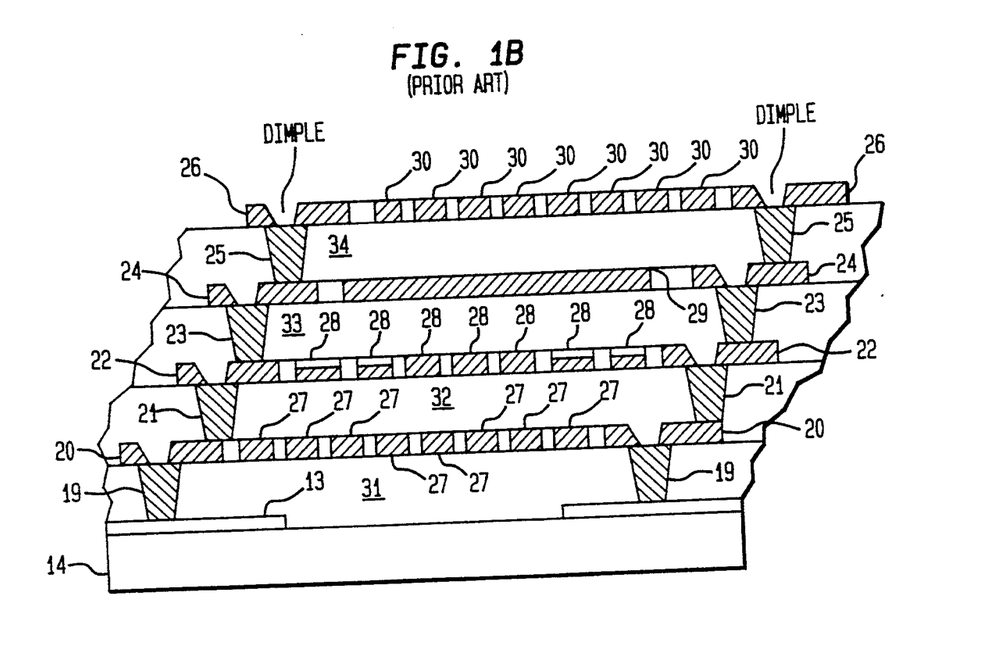
FIG. 1B is a schematic diagram of the cross section of a prior art arrangement of vias based on a non-planar process.

FIG. 1B illustrates a cross section of a thin-film layout similar to FIG. 1A, with the difference that a non-planar process is used, as opposed to a planar process. The non-planar process implies eliminating all planarizing steps, thereby reducing the cost of manufacturing. A non-planar process is clearly the preferred approach in industry due to its reduced cost. Since the planarization step is completely eliminated at all levels, the process produces a local and global non-planarity on the entire structure.

Non-planarity, however, has some serious drawbacks, such as a reduction in reliability, electrical variations, etc., some of which are discussed hereinafter.

Referring to FIG. 1B, vias 19, 20, . . . , and 26 provide vertical connections; 27 and 30 are the reference planes; 28 and 29 are, respectively, the X and Y wiring layers; 31, 32, 33 and 34 are the insulator layers; 13 is a capture pad layer; and 14 the substrate. The non-planar process produces a dimple or void on the via surface due to an uneven deposition of the conductive metal vias 19, 21, 23 and 25 and capture pads 20, 22, 24 and 26. This forces the vias to be rearranged in a non-stacked fashion so that no via aligns itself on top of another via to avoid the possibility of opens caused by the thinning of the metal on the walls of the void. As it is shown in FIG. 1B, vias 19, 21, 23 and 25 are offset laterally in a staircase or linear arrangement. This technique, though necessary, creates three problems, namely:

a.) The reference planes 27 and 30 are laterally displaced from the wiring layers 28 and 29. This causes the conductors in the reference planes to be laterally far away from some of the lines in the wiring layers. In Fig 1B, the first two X conductors in 28 use the reference plane 27 vertically beneath it, and a top reference plane 30 laterally displaced to the right to support return currents. Similarly, the last two X conductors in wiring layer 28 have a top reference plane 30 vertically above it, and a bottom reference plane 27 laterally displaced to the left to support return currents. Since the physical proximity of the reference planes dictate in great part the electrical characteristics of the lines, the first two X conductors, the last two X conductors, and the middle four X conductors differ totally in their electrical characteristics. In FIG. 1B, the lines with uniform electrical characteristics are shown fully shaded and the lines with variable electrical characteristics are shown half shaded. Likewise, the Y lines 29 display a similar behavior. It has been assessed that only 30–40% of the lines have uniform electrical characteristics and the remaining 60–70% have varying electrical characteristics using the present structure/layout. This, potentially, can create a serious problem to module and card designers since the drivers and receivers can never be completely matched to the lines unless they are customized for each line. The reason for the electrical line variation is caused by vias interfering with the lines.

b.) The lateral displacement of planes 27 and 30 causes some wires in layers 28 and 29 to display crests and valleys along their lengths caused by the non-planar process. The crests and valleys also affect the electrical characteristics due to varying capacitances along the wire length. Moreover, the crests and valleys may potentially cause interlevel shorts due to the polyimide thinning at selected points, e.g., when an X wire 28 crosses a hole in the reference plane 27.

c.) Due to non-planarity and the via structure, vias 19, 21, 23 and 25 and capture pads 20, 22, 24 and 26 that provide vertical connections to the chip produce a local and global non-planar top surface with inherent crests and valleys. The lack of uniformity on the surface causes a serious problem when attaching chips to the top surface. This, in turn, impacts the overall reliability since only a small metal contact may end up supporting the entire via current at the chip to via interface. Hence, though the non-planar process is easy and inexpensive to manufacture, the overall structure has many negative features when compared to the planar process of FIG. 1A, and hence it cannot be used in a useful and effective way.

The present invention makes use of the non-planar process to produce a structure that contains all the features of a planar process, i.e., all electrical, mechanical and reliability characteristics.

The structure of the invention will be best understood when explained in combination with FIGS. 1C, 2, 3A, 3B, and 4.

Figure 1C:
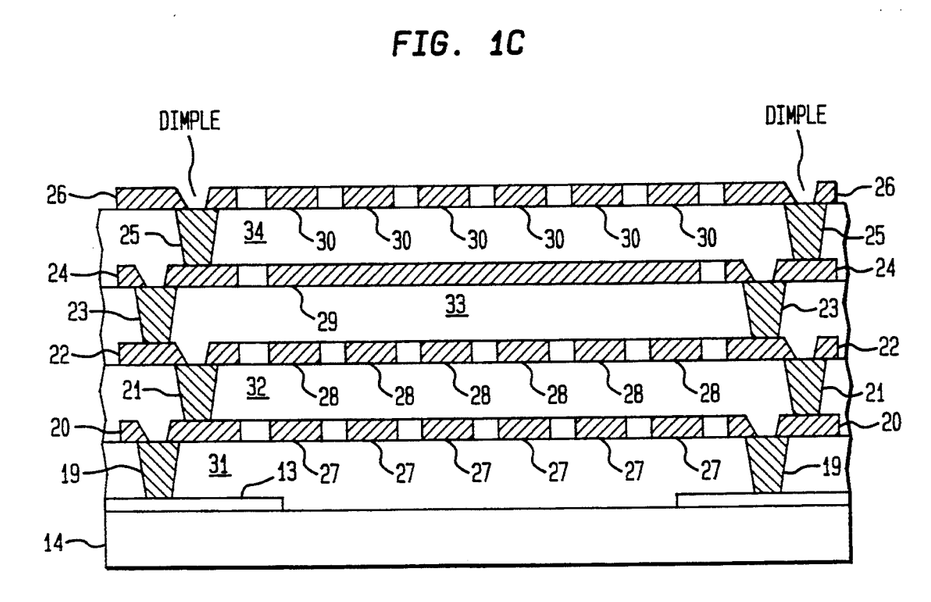
FIG. 1C is a schematic diagram of the cross section of the arrangement of vias in a non-planar environment in accordance with a preferred embodiment of the present invention.

Referring to FIG. 1C, a cross section of the structure in accordance with the present invention is shown. The thin-film structure is fabricated using a non-planar process such as the one used in FIG. 1B. Shown in FIG. 1C are: a substrate 14, a capture pad 13, conductive vias 19, 21, 23 and 25 and capture pads 20, 22, 24 and 26, and reference planes 27 and 30, the X and Y wiring layers 28 and 29, respectively, and insulators 31, 32, 33, and 34. The function performed by the various parts of the structure are the same as in FIGS. 1A and 1B. As in FIG. 1B, the use of the non-planar process produces a dimple on the surface of the vias due to uneven plate-up during fabrication. Hence the vias have to be staggered from one another. The structure of FIG. 1C uses, on each layer, a two dimensional staggering scheme coupled with a vertical non-stacking method (non-linear arrangement), to provide a via structure that is characterized in that:

i.) It does not interfere with the wiring planes and reference planes 28, 29 and 27 and 30, respectively. This results in no lateral displacement of the lines with respect to the reference plane which ensures uniform electrical characteristics. Hence all wiring lines in layers 28 and 29 have the same electrical environment and the same characteristics. This feature is achieved by having the vias totally contained within a vertical channel that does not have any lines or wires in them.

ii.) It provides uniform height to all the vias comprising 19, 21, 23 and 25, thus eliminating the global non-planarity on the top surface. This produces a uniform electrical and mechanical surface for attaching the chips.

FIG. 1C further highlights all the wires in the X and the Y layers, respectively, overlapping the corresponding conductors in the planes 27 and 30. Due to the complete overlap of the conductive layers 28 and 27, 29 and 30 separated by a dielectric layer 32, 34, the wires always follow the corresponding return conductors in the reference plane (or vice versa). Therefore, the dielectric will keep a uniform thickness between the wires and the reference planes. This technique reduces interlevel shorts caused by dielectric thinning, and also maintains the electrical characteristics of the lines constant due to a uniform capacitance along the wire length. Hence the present invention eliminates the disadvantages of the non-planar process and produces a wiring structure with the same characteristics of a planar process.

The exact details of the via structure will now be explained.

FIG. 2 shows a via staggering scheme that connects the substrate via to the chips on the top surface. This method is specially relevant to the voltage vias that supply current to the chips. A similar scheme will be described later for the signal vias. In FIG. 2, the capture pad layer 13 is formed on the substrate 14 (not shown) which connects the substrate vias to the thin film via 19. The capture pad layer is generally formed using a sub-etch process and is generally 2–4μ thick, large enough to capture the substrate vias based on worst case tolerances. Two conductive vias 19 make vertical contact between capture pad 13 and capture pad 20 above it. As shown in the figure, a dimple or valley is created on the surface of the two vias due to the non-planar process. Capture pad 20 is deposited onto the top surface of the via on the same layer as the bottom reference plane 27 in FIG. 1C. Capture pad 20 can be of the same size, smaller or larger than capture pad 13. This is particularly important since capture pad 20 completely or partially overlaps the capture pad 13 that provides planarity in areas of overlap, except where the vias 19 meet the capture pad 20. Due to the dimples or valleys formed, the next set of vias 21 are laterally displaced with respect to vias 19 so that they do not align on top of the dimples of vias 19. At the same time vias 21 are placed within the area of capture pad 20. Vias 21 provide vertical contact between the capture pads 20 and 22. Capture pad 22 is deposited in such a way that it completely overlaps capture pad 20 producing planarity in the overlap areas except at the dimples formed by vias 21. A similar arrangement is used for vias 23, 25 and capture pads 24 and 26. Using the present arrangement, the surface of capture pad 26 is planar in all areas having horizontal capture pads 20, 22 and 24 beneath them. Capture pad 26 still has a dimple on the surface formed by vias 25. The next set of vias 35 are again laterally displaced, and a large pad 36 is formed above it that represents the micro-socket for attaching the chips. Due to the present via arrangement, though the process is non-planar, the large pad 36 at the micro-socket location is planar, and hence it provides an even surface for attaching the chip. In a preferred embodiment, two vias are provided at each via level to increase reliability through current sharing. This is particularly significant since the redundancy makes the process robust by increasing yield for via opens. If necessary, one large via could be provided at each via level, and a similar arrangement can be used. In FIG. 2, capture pad 20 is shown to be larger than capture pad 26. This is because the capture pad 20 is connected laterally to the bottom reference plane 27. Hence the via arrangement shown in FIG. 2 represents a voltage via where the redundancy has been used to make the process more robust. The via redundancy is not required for signal vias due to the small current carried by signal vias. Hence the two vias need not be physically connected on capture pads 22 and 24 for signal vias which will be shown hereinafter, thus increasing wirability. A similar voltage via arrangement with capture pad 26 connected to the top reference plane (capture pad 26 larger than capture pad 20) could be used for a different voltage level for the reference plane 30.

FIG. 2 shows three coordinate axis x,y, and z, orthogonal to each other. The line joining the pair of vias 19 is rotated with respect to the (+) x-axis by −45°. The next set of vias 21 above thin-film metal layer 20 has the line connecting them rotated with respect to the (+) x-axis by +45°, such that vias 21 do not line up vertically directly on top of vias 19 (i.e., vias 19 are 21 offset with respect to one another). Thus, the total rotation between vias 19 and 21 is 90° in the anti-clockwise direction. Similarly, the pair of vias 23 above metal thin-film layer 22 has the line joining them rotate with respect to the (+) x-axis by 180°, such the vias 19, 21 and 23 do not directly align themselves on top of each other. Vias 25 on top of layer 24 have the line connecting them rotated with respect to the (+) x-axis by +270°, such that vias 19, 21, 23 and 25 are offset with respect to each other. Finally, vias 35 have their connecting line rotated by +360° with respect to the (+) x-axis, such that vias 19, 21, 23, 25, and 35 do not verticallly line up with respect to each other. Thus, the connecting vias start at −45° with respect to the (+) x-axis and rotate in an anti-clockwise direction successively along the z-axis to +45°, +180°, +270°, and 360° with respect to the (+) X-axis, thereby forming a spiral or helix (these terms are used henceforth interchangeably). It is evident that a dual set of connected vias (for current sharing purposes) would likewise create a double helix (or double spiral).

Figure 3B:
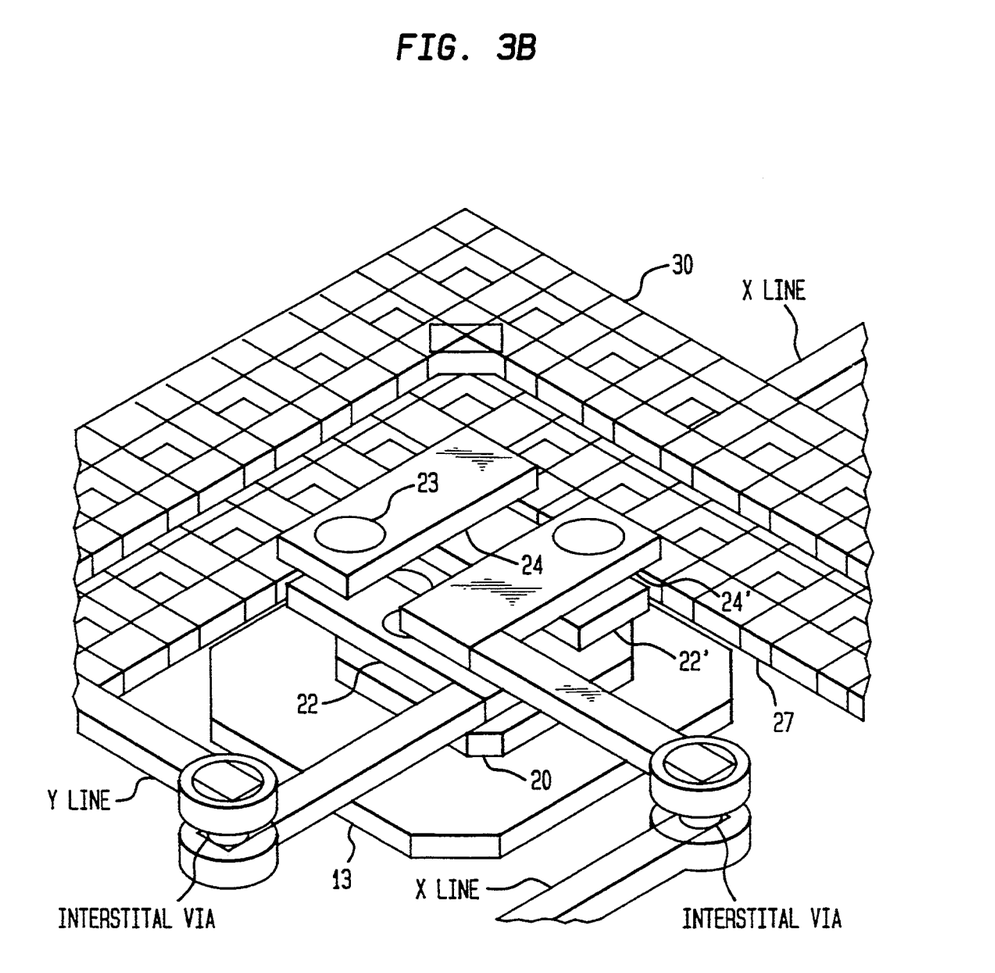
FIG. 3B is a perspective view of the same arrangement shown in FIG. 3A showing how lines in various layers may change direction through the use of interstitial vias.

The via arrangement for a signal through via is shown in FIG. 3A. The basic principle of the via arrangement is similar to FIG. 2. However, the difference is that the two vias are electrically separated on capture pads 22, 22′ and 24, 24′. As before, the capture pads always overlap the capture pads beneath, thus ensuring planarity. In FIG. 3A, vias 21, 23 and 25 are programmable and may or may not be formed based on the wiring. Capture pads 22, 24 and vias 23 are used as translation layers to change wiring directions from X to Y or from Y to X. An example of the use of the via arrangement for a change in direction of the wiring is shown in FIG. 3B. In the drawing, vias 25 have not been formed (programmable) and, hence, the connections to a micro-socket do not have any connection to capture pads 24. A wire on X can now connect to the capture pad 22, translate onto capture pad 24 through via 23, connect to a wire in the Y direction, and then drop onto an X wire in a different channel by means of an interstitial via that is positioned at alternate intersections of the X,Y wiring. A similar concept can be used whereby a Y wire connects to a capture pad 24, translates onto the capture pad 22 through via 23 which can then connect to an X or a Y wire in a different channel through an interstitial via (shown in FIG. 3B). Thus two sets of vias at signal locations can be used as direction changers, which considerably increases wirability. On the other hand, if reliability is the most important factor and wirability not an issue, the redundant via arrangement in FIG. 2 can be used, but with the difference that capture pads 20 and 26 are not connected to the reference plane.

The via arrangement which is based on a laterally displaced vertical column concept has three basic uses, namely:

a.) The through vias occur within a vertical column of space and do not have any X,Y wires in that area (unless the X,Y translation scheme is used for the signal vias). Hence the vias do not interfere with the lines as in the planar process of FIG. 1A.

b.) Due to the via arrangement, the large pad 36 (FIG. 2) is planar and provides a clean electrical surface for chip attach as in the planar process.

c.) The X,Y translators at via locations increase wirability and thus enhance the connectivity.

Figure 4:
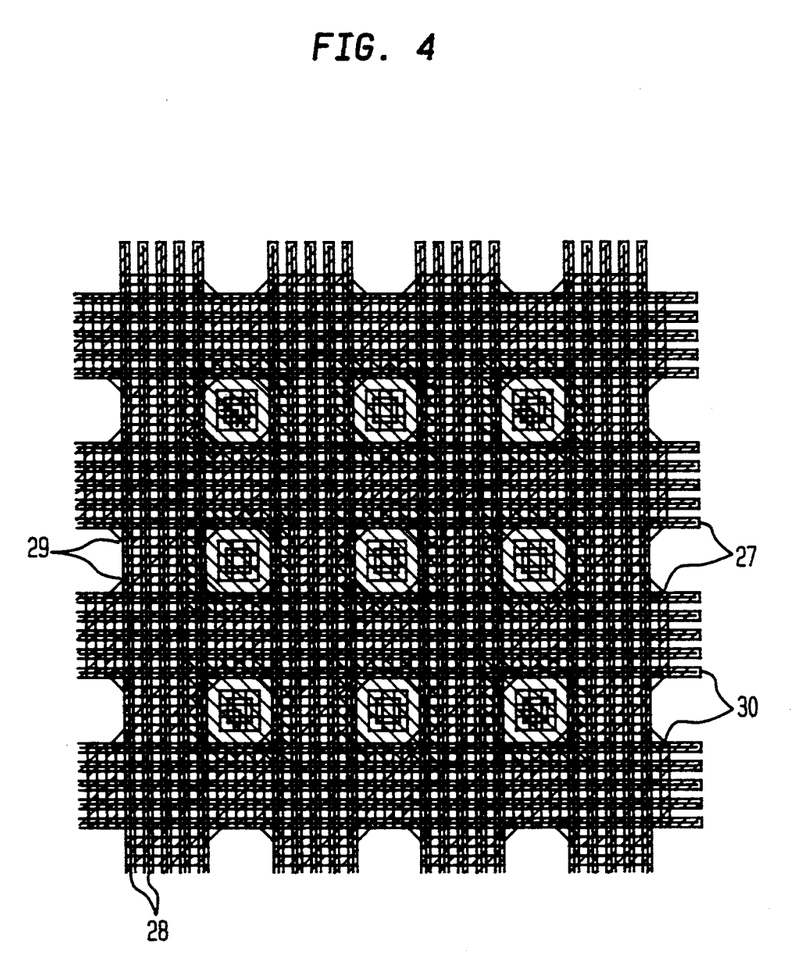
FIG. 4 is an example of a mesh plane used in conjunction with the layout of the present invention.

A preferred wiring layout is shown in FIG. 4. The bottom reference plane 27 is comprised of a series of X and Y conductors that are electrically connected with openings provided for the through vias to contact the chips. This scheme is required from a process standpoint due to outgassing of the polymer because of thermal cycling. A solid plane cannot be used for reference planes 27 and 30 since outgassing of the thin film material causes metal to blister or break. The X wiring layer 28 is deposited in such a way that the wires overlap the corresponding X conductors of reference plane 27. In the preferred embodiment, the conductors in reference plane 27 are wider than the wires in X wiring layer 28. This overlapping scheme ensures that a uniform dielectric layer always exists between the X wires and the corresponding conductors of reference plane 27, thus maintaining the same capacitance along the wire length. Wiring layer 29 is next deposited and reference layer 30 is formed next with the X and Y conductors overlapping the X wires 28 and Y wires 29. Using this method, the top reference plane 30 always follows the corresponding Y wires 29, thus maintaining the same capacitance along the wire length. Though Y wiring layer 29 has crests and valleys with respect to reference plane 27, and reference plane 30 has crests and valleys with respect to X wiring layer 28, the reference planes 27, 30 are farther away and, hence, have a small impact on the electrical characteristics of the line. Moreover, though crests and valleys exist, all the lines have the same electrical characteristics. The use of a parallel mesh layout as shown in FIG. 4 for reference planes 27 and 30 with the X,Y wires on wiring layers 28, 29 completely shielded provide a uniform electrical environment for propagating high speed signals. Thus, the transmission lines in the non-planar structure have the same electrical characteristics as the lines in the planar structure.

Based on the above explanations, a structure has been created using a non-planar process with all the features of a planar process.

The structure described in this invention can be used to build multiple plane pairs of thin film, vertically above each other. The top layer of the thin film structure could be easily planarized due to uniform height of the top vias and multiple layers using a similar layout described in this invention could be built. Due to the present layout, the electrical characteristics in the two plane pairs are identical. Hence multiple plane pairs can be built by introducing just one planarization step per plane pair.

Based on the above explanations, a structure has been created using a non-planar process with all the features of a planar process.

While this invention has been particularly described with reference to the preferred embodiments thereof, it will be understood by those skilled in the art that the foregoing and other changes in form and details may be made therein without departing from the spirit and scope of the invention.

What is claimed is:

1. An arrangement of vias in a thin-film structure, comprising:
   a substrate;
   a plurality of thin-film layers stacked on top of each other placed above said substrate, each of said layers having a conductive pattern and a plurality of vias, said vias providing a connection between the conductive pattern in one of said layers to the conductive pattern in another of said layers;
   at least one of said vias in one of said layers being offset from and in electrical contact with at least a via in another layer, and wherein
   a plurality of said connecting vias are stacked in a non-linear, non-planar arrangement forming a helix.

2. The arrangement of vias as recited in claim 1, wherein said plurality of contacting vias forms a multiple spiral providing a multiple path for each of said contacting vias to achieve current sharing between said contacting vias.

3. An arrangement of vias in a non-planar thin-film structure comprising:
   a substrate;
   a plurality of thin-film layers stacked on top of each other placed above said substrate, each of said layers having a conductive pattern and a plurality of vias, said vias providing a connection between the conductive pattern in one of said layers to the conductive pattern in another of said layers,
   a plurality of said vias having a dimple on one surface, thereby creating a non-planar environment, and at least one of said plurality of vias in one of said layers being offset from and in electrical contact with at least a via in another layer, and wherein
   said plurality of offset contacting vias are stacked in a non-linear arrangement forming a helix.

4. The arrangement of vias as recited in claim 3, wherein said plurality of contacting vias forms a multiple spiral providing a multiple path for each of said contacting vias to achieve current sharing between said contacting vias.

5. The arrangement of vias as recited in claim 3, wherein said plurality of contacting vias forms a multiple spiral providing a multiple path for each of said contacting vias to achieve current sharing between said contacting vias.

6. The arrangement of vias in a non-planar thin-film structure as recited in claim 3, further comprising a dielectric layer placed above the topmost of said stacked layers.

7. The arrangement of vias in a non-planar thin-film structure as recited in claim 6, further comprising:
   a second plurality of thin-film layers placed above said dielectric layer, each of said second plurality of Layers having a conductive pattern and a plurality of vias, said vias providing a connection between the conductive pattern in one of said second plurality of layers to the conductive pattern in another of said second plurality of layers, wherein
   at least one of said vias in one of said second plurality of layers is offset from and in electrical contact with at least a vias in another layer, and wherein
   a plurality of said contacting vias are stacked in a non-linear, non-planar arrangement forming a helix.

8. An arrangement of vias in a non-planar thin-film structure comprising:

a substrate;

at least one wiring layer on top of said substrate having electrical connecting lines, at least one reference layer adjacent to said at least one thin-film layers for supplying power and for converting said connecting lines into transmission lines by providing a return electrical path to the transmission lines;

a plurality of vias in each of said layers for providing an electrical path between said connecting lines in one of said layers to said lines in another of said layers and for providing an electrical path from one of said reference layers to terminal metal placed on top of the structure, wherein at least one of said vias in one of said layers being offset from and in electrical contact with at least a via in another layer, and wherein a plurality of said contacting vias are positioned in a non-linear, non-planar arrangement forming a helix.

9. The arrangement of vias in a non-planar thin-film structure as recited in claim 8, wherein a plurality of said vias have a dimple on a surface.

10. The arrangement of vias as recited in claim 8, wherein said at least one reference layer is further comprised of conductors arranged in an orthogonal arrangement.

11. The arrangement of vias as recited in claim 8, wherein said connecting lines in said at least one wiring layer are vertically above a corresponding one of said conducting lines in said reference layer to provide electrical shielding and maintain a uniform separation between said connecting lines in said at least one wiring layer and said connecting lines in said at least one reference plane.

12. The arrangement of vias as recited in claim 8, wherein said plurality of interconnected vias provides an electrical path from said at least one reference layer to chips attached to the top surface of the structure.

13. The arrangement of vias as recited in claim 8, wherein said interconnecting lines provide intrachip and interchip electrical connections.

14. The arrangement of vias as recited in claim 8, wherein said plurality of contacting vias forms a multiple spiral providing a multiple path for each of said contacting vias to achieve current sharing between said contacting vias.

15. The arrangement of vias in a non-planar thin-film structure as recited in claim 9, wherein said plurality of vias provide an electrical path between said connecting lines in one of said layers to said lines in one of said layers and for providing an electrical path from one of said reference layers to terminal metal placed on top of the structure.

* * * * *